United States Patent
Lu et al.

(10) Patent No.: US 10,504,431 B2
(45) Date of Patent: Dec. 10, 2019

(54) TFT PIXEL THRESHOLD VOLTAGE COMPENSATION CIRCUIT WITH LIGHT-EMITTING DEVICE INITIALIZATION

(71) Applicant: Sharp Kabushiki Kaisha, Osaka (JP)

(72) Inventors: Tong Lu, Oxford (GB); Michael James Brownlow, Oxford (GB); Tim Michael Smeeton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/936,519

(22) Filed: Mar. 27, 2018

(65) Prior Publication Data

US 2019/0304361 A1     Oct. 3, 2019

(51) Int. Cl.
*G09G 3/3233* (2016.01)
*H01L 27/32* (2006.01)

(52) U.S. Cl.
CPC ....... *G09G 3/3233* (2013.01); *H01L 27/3248* (2013.01); *H01L 27/3262* (2013.01); *H01L 27/3265* (2013.01); *G09G 2300/0861* (2013.01); *G09G 2310/0243* (2013.01); *G09G 2320/043* (2013.01)

(58) Field of Classification Search
CPC ......... G09G 3/3233; G09G 2300/0861; G09G 2310/0243; G09G 2320/043; H01L 27/3248; H01L 27/3262; H01L 27/3265
USPC ..................................................... 345/76–83
See application file for complete search history.

(56) References Cited

U.S. PATENT DOCUMENTS

| | | | |
|---|---|---|---|
| 7,414,599 B2 | 8/2008 | Chung et al. | |
| 7,936,322 B2 | 5/2011 | Chung et al. | |
| 8,237,637 B2 | 8/2012 | Chung | |
| 8,314,788 B2 | 11/2012 | Choi | |

(Continued)

*Primary Examiner* — Michael Pervan
(74) *Attorney, Agent, or Firm* — Renner, Otto, Boisselle & Sklar, LLP

(57) ABSTRACT

A pixel circuit for a display device includes a drive transistor configured to control an amount of current to a light-emitting device depending upon a voltage applied to a gate of the drive transistor; a second transistor connected to the gate of the drive transistor and a second terminal of the drive transistor such that, when the second transistor is in an on state the drive transistor becomes diode-connected such that the gate and a second terminal of the drive transistor are connected through the second transistor; a light-emitting device that is connected at a first node to the second terminal of the drive transistor and at a second node to a first voltage supply; a third transistor that is connected between an initialization voltage supply and the first node of the light-emitting device, wherein a node N1 is a connection of the second terminal of the drive transistor, the first node of the light-emitting device, and the third transistor; and at least one capacitor having a first plate that is connected to the gate of the drive transistor and a second plate that is connectable to a reference voltage supply. The pixel circuit is operable in an initialization phase to initialize circuit voltages, in a compensation phase to compensate for variations in drive transistor properties, in a programming phase to program a greyscale value to the pixel circuit, and in an emission phase in which the light-emitting device emits light corresponding to the greyscale value.

20 Claims, 4 Drawing Sheets

(56) References Cited

U.S. PATENT DOCUMENTS

| | | |
|---|---|---|
| 9,337,439 B2 | 5/2016 | Kwon |
| 9,489,894 B2 | 11/2016 | Yin et al. |
| 2018/0151115 A1* | 5/2018 | Tseng .................... G09G 3/325 |

* cited by examiner

TFT PIXEL THRESHOLD VOLTAGE COMPENSATION CIRCUIT WITH LIGHT-EMITTING DEVICE INITIALIZATION

TECHNICAL FIELD

The present invention relates to design and operation of electronic circuits for delivering electrical current to an element in a display device, such as for example to an organic light-emitting diode (OLED) in the pixel of an active matrix OLED (AMOLED) display device.

BACKGROUND ART

Organic light-emitting diodes (OLED) generate light by re-combination of electrons and holes, and emit light when a bias is applied between the anode and cathode such that an electrical current passes between them. The brightness of the light is related to the amount of the current. If there is no current, there will be no light emission, so OLED technology is a type of technology capable of absolute blacks and achieving almost "infinite" contrast ratio between pixels when used in display applications.

Several approaches are taught in the prior art for pixel thin film transistor (TFT) circuits to deliver current to an element of a display device, such as for example an organic light-emitting diode (OLED), through a drive transistor. In one example, an input signal, such as a low "SCAN" signal, is employed to switch transistors in the circuit to permit a data voltage, VDAT, to be stored at a storage capacitor during a programming phase. When the SCAN signal is high and VDAT is isolated from the circuit by a switch transistor closing, the VDAT voltage is retained by the capacitor and this voltage is applied to a gate of a drive transistor. With the drive transistor having a threshold voltage $V_{TH}$, the amount of current to the OLED is related to the voltage on the gate of the drive transistor by:

$$I_{OLED} = \frac{\beta}{2}(V_{DAT} - V_{OLED} - V_{TH})^2$$

($\beta$ is a constant related to the properties of the drive transistor).

TFT device characteristics, especially the TFT threshold voltage $V_{TH}$, may vary, for example due to manufacturing processes or stress and aging of the TFT device during the operation. With the same VDAT voltage, the amount of current delivered by the drive TFT could vary by a large amount due to such threshold voltage variations. Therefore, pixels in a display may not exhibit uniform brightness for a given VDAT value.

Conventionally, therefore, OLED pixel circuits have high tolerance ranges to variations in threshold voltage and/or carrier mobility of the drive transistor by employing circuits that compensate for mismatch in the properties of the drive transistor. For example, an approach is described in U.S. Pat. No. 7,414,599 (Chung et al., issued Aug. 19, 2008), which describes a circuit in which the drive TFT is configured to be a diode-connected device during a programming period, and a data voltage is applied to the source of the drive transistor.

With such circuit configuration, however, the anode of the OLED is not reset in relation to the programming phase. Rather, there will be residual voltage at the OLED anode. When emission starts and the emission current flows through the OLED during the emission phase, the OLED will need some time to refresh the data voltage at the anode. A first problem with this is that it may affect the true black state. If the previous frame data voltage corresponds to a white grayscale and the current frame data voltage corresponds to a black grayscale, for example, there will be some light emission due to the residual voltage at the beginning of the emission phase. The true black state will be compromised. A second problem is memory effects from the previous frame data. If the programmed current is a low current, it could take a significant time to refresh the anode to the programmed value. During the refresh period, the light emission could vary due to the previous residual data at the anode of the OLED, which means the same programmed data could have different light emission as affected by the previous frame data, especially for relative small emission current.

Another approach is described in U.S. Pat. No. 8,314,788 (Choi, issued Nov. 12, 2012). In such circuit, the diode-connection voltage for a drive transistor is pulled down by changing the voltage level at the top plate of the storage capacitor. There are significant drawbacks with such configuration and method. First, when pulling down the gate voltage of the drive transistor, the diode-connected drive transistor is forward biased, and there could be a large instant current to the OLED. This may cause an instance of high luminance light, which would prevent a pixel from ever having a true black state. Second, the anode of the OLED and the gate voltage of the drive transistor would hold the voltage from the previous frame. As there is no initialization or reset scheme, the voltage from the previous frame could affect the programmed voltage for the current frame. Therefore, the current to the OLED during a frame may be affected by the state in the previous frame, as well as by the applied data.

Other approaches to address the above problems have proven deficient. U.S. Pat. No. 7,936,322 (Chung et al., issued May 3, 2011) describes a scheme to reduce the number of transistors to five by overlapping scan and emission control signals. This approach, however, could cause a leakage current during the programming phase, which may affect the blackness in low current operations. U.S. Pat. No. 8,237,637 (Chung, issued Aug. 7, 2012) describes a scheme to improve the blackness and remove the memory effects on the anode of the OLED by adding one more transistor between the initial voltage and the anode. This configuration, however, increases the transistor number to seven in the circuit, which will lower the yield and be difficult to implement in high resolution applications requiring a small geometry. U.S. Pat. No. 8,314,788 (Choi, issued Nov. 12, 2012) describes a scheme to reduce the number of transistors by pulling down the gate voltage of the drive transistor to save the isolation transistor between the driving transistor and OLED. With such configuration, however, there could be high instant current during programming phase. There is no initialization scheme, and thus memory effects could affect the true blackness. U.S. Pat. No. 9,337,439 (Kwon, issued May 10, 2016) describes a scheme to improve the blackness by using previous data, but the number of transistors is still high and the residual voltage at the anode of the OLED could still cause some light leakage for low emission current. U.S. Pat. No. 9,489,894B2 (Yin et al.) describes a scheme to use ELVDD as an initial signal, which reduces the signal lines by one. This approach, however, still has the same number of transistors as U.S. Pat. No. 7,414,599, and the same residual memory effects at the anode of the OLED.

SUMMARY OF INVENTION

The present invention relates to pixel circuits that are capable of compensating the threshold voltage variations of the drive transistor with fewer transistors than in conventional configurations, with additionally (1) reducing or eliminating the possible memory effects associated with the OLED device and drive transistor from their states in the previous frame; and (2) improving the capability of a pixel to emit very little or no light during an initialization phase and therefore to have a true black state.

A pixel circuit for delivering a required current to an OLED has a drive transistor that sets the current supplied to the OLED during an emission phase according to a voltage at the gate of the drive transistor, the gate voltage being stored on a storage capacitor. The pixel circuit is configured such that during an initialization phase, an initialization voltage (INIT) is applied simultaneously at the gate of the drive transistor, at the first plate of the storage capacitor, and at a first terminal (and preferably the anode) of the OLED.

In exemplary embodiments, the value of the initialization voltage is set such that the difference between the initialization voltage and the voltage at the second terminal (preferably the cathode) of the OLED (ELVSS) is:
  i) less than the threshold voltage of the OLED ($VTH_{OLED}$), which is the minimum forward bias which when applied to the OLED for the duration of the initialization phase causes light emission discernible to a human eye: $INIT-ELVSS<VTH_{OLED}$
  and
  ii) greater than the reverse bias on the OLED which causes damage to the OLED. For example: $INIT-ELVSS>-2V$.

The initialization voltage may be in the range:
  $-2V<INIT-ELVSS<VTH_{OLED}$.

In exemplary embodiments the value of INIT−ELVSS is less than 0V such that the OLED is reverse biased during the initialization phase. Advantageously, this enables the voltage range for the pixel circuit (i.e., the difference between the highest voltage in the pixel circuit and the lowest voltage in the pixel circuit) to be reduced while still providing effective compensation of the threshold voltage of the drive transistor. The reduced range for the pixel circuit enables lower power consumption for a driver of the display.

The drain of the drive transistor may be connected to the anode of the OLED such that during the initialization phase, an initialization voltage (INIT) is applied simultaneously at the gate of the drive transistor, at one plate of the storage capacitor, at the anode of the OLED, and at the drain of the drive transistor. During this initialization phase, the memory effects associated with the OLED and the gate of the drive transistor from their states in the previous frame are reduced or eliminated.

The pixel circuit may be further configured with one or more of the following features and modes of operation:
  (1) During a subsequent threshold voltage compensation phase, a relatively high fixed voltage is applied at the source of the drive transistor, and thereby a voltage related to the threshold voltage of the drive transistor may be stored on the storage capacitor. Preferably, this voltage is set at a level that does not cause the OLED to emit light.
  (2) During a subsequent data programming phase, a reference voltage (VREF) is applied to the second plate of the storage capacitor which pulls down the voltage at the gate of the drive transistor. The gate voltage of the drive transistor may be pulled down close to the initialization voltage. A data voltage may then be programmed to the storage capacitor through a diode-connected state of the drive transistor.
  (3) VREF is set to boost the gate voltage of the drive transistor to an emission voltage level that drives the light emission from the OLED during an emission phase.
  (4) At the beginning of the emission phase, an emission second initialization phase is used to improve the threshold compensation performance when the current passed by the drive transistor during the subsequent emission phase is low. During this phase a second initialization voltage is applied to the anode of the OLED.

Embodiments of the present invention have advantages over conventional configurations. Such advantages include, for example, using as little as only five transistors and one storage capacitor, thereby providing a smaller circuit as compared to conventional configurations. In addition, the pixel circuit configurations of the present disclosure improve the true blackness by reversely biasing the OLED in phases that precede the emission phase, and improve the accuracy of threshold voltage compensation of the drive transistor especially for low OLED currents.

An aspect of the invention is a pixel circuit for a display device that is operable in an initialization phase, in a compensation phase, in a programming phase, and in an emission phase. In exemplary embodiments, the pixel circuit includes: a drive transistor configured to control an amount of current to a light-emitting device during the emission phase depending upon a voltage applied to a gate of the drive transistor; a second transistor connected to the gate of the drive transistor, wherein the second transistor is in an on state during the initialization, compensation and programming phases and is in an off state during the emission phase, and when the second transistor is in the on state the drive transistor becomes diode-connected such that the gate and a second terminal of the drive transistor are connected through the second transistor; a light-emitting device that is connected at a first node to the second terminal of the drive transistor and at a second node to a first voltage supply; a third transistor that is connected to the first node of the light-emitting device, wherein a node N1 is a connection of the second terminal of the drive transistor, the first node of the light-emitting device, and the third transistor; and at least one capacitor having a first plate that is connected to the gate of the drive transistor and a second plate that is connectable to a reference voltage. The third transistor is in an on state during the initialization phase to connect a first initialization voltage to the node N1, and to the first plate of the capacitor through the second transistor, to initialize a voltage across the light-emitting device, and the third transistor is in an off state during the emission phase; and when the reference voltage is applied to the second plate of the capacitor, a threshold voltage of the drive transistor is at least partially compensated during the compensation phase. The pixel circuit further is operable during an emission second initialization phase, wherein during the second initialization phase the third transistor is in an on state to connect a second initialization voltage to the node N1.

In exemplary embodiments, the pixel circuit further includes a fourth transistor that is connected to a third terminal of the drive transistor, wherein the fourth transistor is in an on state during the programming phase to apply a data voltage corresponding to a greyscale value for the light-emitting device for the emission phase. The pixel circuit further includes a fifth transistor that is connected to the third terminal of the drive transistor, wherein during the emission phase the fifth transistor is in an on state to connect the drive transistor to a second voltage supply. The pixel circuit further may include a sixth transistor that is connected to the third terminal of the drive transistor, wherein during the compensation phase the sixth transistor is in an on state to apply a fixed voltage to the third terminal of the drive transistor.

Another aspect of the invention is a method of operating a pixel circuit for a display device including the steps of: providing a pixel circuit according to any of the embodiments; and performing an initialization phase, a compensation phase, a programming phase, and an emission phase. During the initialization phase, memory effects from previous frames are reduced by performing the steps of: placing the fourth transistor in the off state, and placing the fifth transistor in the off state to disconnect the second voltage supply from the pixel circuit; placing the third transistor in the on state to apply a first initialization voltage to the first node of the light-emitting device; placing the second transistor in an on state, wherein the drive transistor becomes diode-connected through the second transistor; and placing the third transistor in the off state at an end of the initialization phase. During the compensation phase, a threshold voltage of the drive transistor is at least partially compensated by the steps of: placing the fourth transistor in an on state and applying a reference data voltage to the third terminal of the drive transistor, wherein the reference data voltage is set such that a voltage across the light-emitting device is below a threshold voltage of the light emitting device. During the programming phase, a data voltage corresponding to a current greyscale value is applied by the steps of: applying a reference voltage to the second plate of the capacitor to a level for programming the full data range; changing the data voltage supply from the reference data voltage to a current data voltage corresponding to a required current through the light-emitting device during the emission phase; placing the fourth transistor in an off state after applying the current data voltage; and placing the second transistor in an off state such that the drive transistor is no longer diode-connected, wherein the current data voltage is stored by the storage capacitor. During the emission phase, control of light emission is performed by the steps of: adjusting the reference voltage applied to the second plate of the capacitor to change the gate voltage of the drive transistor to the operational voltage range, in which the drive transistor controls the amount of current to the light-emitting device; placing the fifth transistor in the on state to connect the second power supply to the drive transistor; and controlling an amount of current to the light-emitting device depending upon a voltage applied to a gate of a drive transistor.

The operating method may include, after the programming phase and at the beginning of the emission phase, performing an emission second initialization phase to reset the voltage at the first node of the light-emitting device by the steps of: placing the third transistor in an on state and applying a second initialization voltage to the first node of the light-emitting device; and changing the state of the third transistor from the on state to the off state prior to the emission phase.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF EMBODIMENTS

Figure 1:
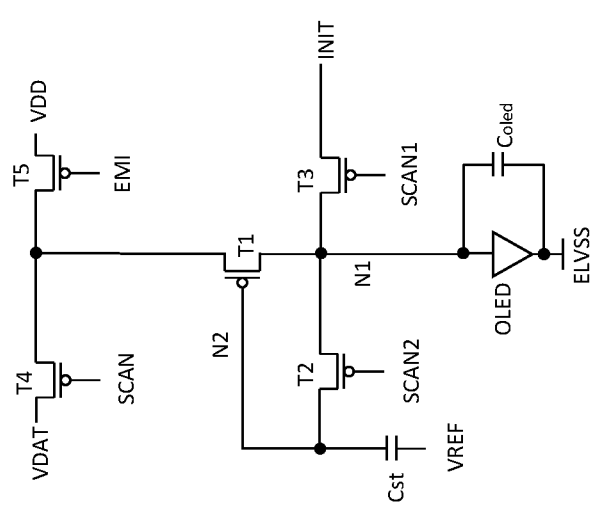
FIG. 1 is a drawing depicting a first circuit configuration in accordance with embodiments of the present invention.

Embodiments of the present invention will now be described with reference to the drawings, wherein like reference numerals are used to refer to like elements throughout. It will be understood that the figures are not necessarily to scale.

Figure 2:
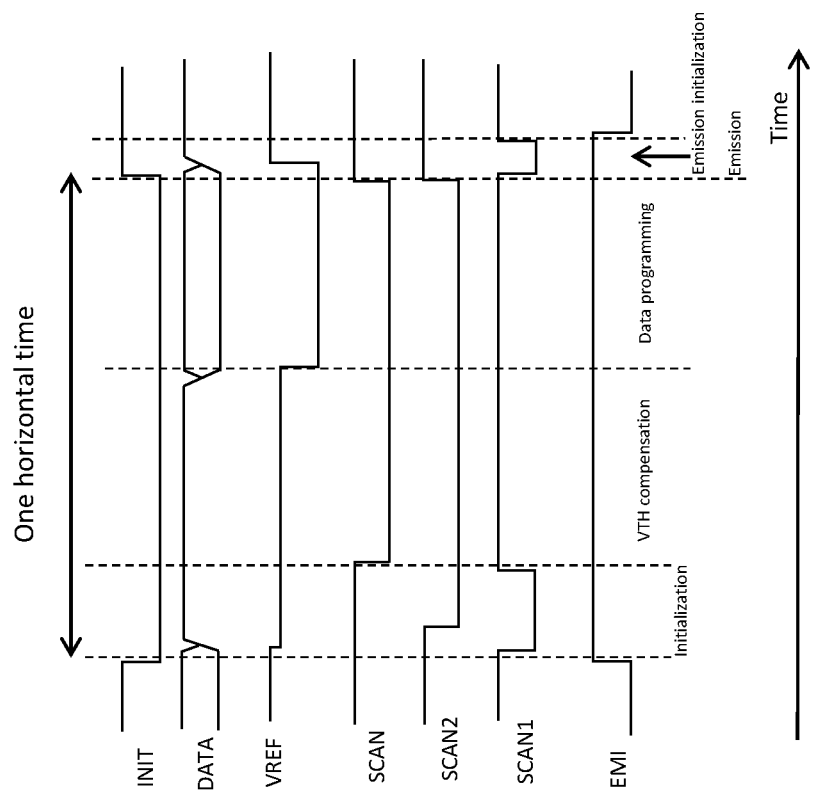
FIG. 2 is a timing diagram associated with the circuit configuration of FIG. 1.

FIG. 1 is a drawing depicting a first circuit configuration 10 in accordance with embodiments of the present invention, and FIG. 2 is a timing diagram associated with the circuit configuration of FIG. 1. In this example, the circuit 10 is configured as a TFT circuit that includes multiple p-type transistors T1-T5 and a single storage capacitor Cst having a first plate that is connected to the gate of the drive transistor T1. The circuit elements drive a light-emitting device, such as for example an OLED. The light-emitting device (OLED) has an associated internal capacitance, which is represented in the circuit diagram as $C_{oled}$. In addition, although the embodiments are described principally in connection with an OLED as the light-emitting device, comparable principles may be used with display technologies that employ other types of light-emitting devices, including for example micro LEDs and quantum dot LEDs.

More specifically, FIG. 1 depicts the TFT circuit 10 configured with multiple p-MOS or p-type TFTs. T1 is a drive transistor that is an analogue TFT, and T2-T5 are digital switch TFTs. As referenced above, Cst is a capacitor, and $C_{oled}$ is the internal capacitance of the OLED device (i.e., $C_{oled}$ is not a separate component, but is inherent to the OLED). The OLED further is connected to a first power supply ELVSS as is conventional.

The OLED and the TFT circuit 10, including the transistors, capacitors and connecting wires, may be fabricated using TFT fabrication processes conventional in the art. It will be appreciated that comparable fabrication processes may be employed to fabricate the TFT circuits according to any of the embodiments.

For example, the TFT circuit 10 (and subsequent embodiments) may be disposed on a substrate such as a glass, plastic, or metal substrate. Each TFT may comprise a gate electrode, a gate insulating layer, a semiconducting layer, a first electrode, and a second electrode. The semiconducting layer is disposed on the substrate. The gate insulating layer is disposed on the semiconducting layer, and the gate electrode may be disposed on the insulating layer. The first electrode and second electrode may be disposed on the insulating layer and connected to the semiconducting layer using vias. The first electrode and second electrode respectively may commonly be referred to as the "source electrode" and "drain electrode" of the TFT. The capacitor may comprise a first electrode, an insulating layer and a second electrode, whereby the insulating layer forms an insulating barrier between the first and second electrodes. Wiring between components in the circuit, and wiring used to introduce signals to the circuit (e.g. SCAN, EMI, VDATA, VREF) may comprise metal lines or a doped semiconductor material. For example, metal lines may be disposed between the substrate and the gate electrode of a TFT, and connected to electrodes using vias. The semiconductor layer may be deposited by chemical vapour deposition, and metal layers may be deposited by a thermal evaporation technique.

The OLED device may be disposed over the TFT circuit. The OLED device may comprise a first electrode (e.g. anode of the OLED), which is connected to transistors T1, T2, and T3 in this example, one or more layers for injecting or transporting charge (e.g. holes) to an emission layer, an emission layer, one or more layers for injecting or transporting electrical charge (e.g. electrons) to the emission layer, and a second electrode (e.g. cathode of the OLED), which is connected to first power supply ELVSS in this example. The injection layers, transport layers and emission layer may be organic materials, the first and second electrodes may be metals, and all of these layers may be deposited by a thermal evaporation technique.

Referring to the TFT circuit 10 in combination with the timing diagram in FIG. 2, the TFT circuit 10 operates to perform in the following phases: (1) a first initialization phase, (2) a threshold voltage compensation phase (3) a data programming phase, and (4) an emission phase for light emission including an optional emission second initialization phase. The time period through the completion of the data programming phase is referred to in the art as the "horizontal time" or "1H" as illustrated in FIG. 2 and subsequent the timing diagrams. A short 1H time is a requirement for displays with a large number of pixels in a column, as is necessary for high-resolution displays. In the example of FIG. 1, therefore, 1H encompasses the first initialization phase, the threshold voltage compensation phase, and the data programming phase.

In this first embodiment, during the first initialization phase memory effects from residual voltages from the previous frame are essentially eliminated. At the outset, an EMI signal level is set to a high voltage value, causing transistor T5 to be off. Consequently, the source of the drive transistor T1 is disconnected from a second power supply, VDD. In addition, an initialization voltage signal (INIT) is changed from a high reference voltage level, INIT_H, to a low reference voltage level INIT_L. Preferably, INIT_H is similar to the voltage at the anode of the OLED that results in the lowest light emission from the OLED during the emission phase for typical operation of the display. Accordingly, INIT_L, being lower than INIT_H, has a value that may reverse bias the OLED, i.e., INIT_L may be is less than ELVSS. The value of INIT_L also should be set so as not to cause significant degradation of the OLED.

Further during the first initialization phase, a SCAN1 signal level is changed from a high value to a low value, causing transistor T3 to be turned on. Consequently, the low initialization voltage, INIT_L is applied at node N1, which is at the anode of the OLED. The application of the initialization voltage INIT_L operates to eliminate memory effects from a previous frame, as any residual voltage at the anode of the OLED from the previous frame will be reset to INIT_L.

Further during the first initialization phase, a SCAN2 signal level is changed from a high voltage value to a low voltage value, causing transistor T2 to be turned on. Consequently, the drive transistor T1 becomes "diode-connected" through transistor T2. Diode-connected refers to the drive transistor T1 being operated with its gate and a second terminal (e.g., source or drain) being connected, such that current flows in one direction. When the drive transistor T1 is diode-connected in this fashion, the gate and drain of the drive transistor are initialized to the INIT_L voltage through transistors T2 and T3. In this manner, the initialization voltage INIT_L is applied simultaneously at the gate of the drive transistor, at a first (top) plate of the storage capacitor, at the anode of the OLED, and at the drain of the drive transistor. During this initialization phase, therefore, the memory effects associated with the OLED and the gate of the drive transistor from their states in the previous frame are reduced or eliminated.

The turn-on sequence of the transistors, specifically turning on T3 followed by T2, is a preferred sequence of operation to ensure that there is no light emission from the OLED. For example, if T2 is turned on before T3, a residual voltage at the gate of the drive transistor T1 could cause light emission in the diode-connected state when the gate of drive transistor T1 is connected to the anode of the OLED through transistor T2. As referenced above, with the drive transistor T1 diode-connected, the initialization voltage also is applied at the first (top) plate of the storage capacitor Cst.

Further during the first initialization phase, a reference voltage that is applied at the second (bottom) plate of the storage capacitor Cst, VREF, is changed to a mid reference level, VREF_M, as part of the initialization. Generally as used herein, the input reference voltage VREF can be set to three different values, referred to herein a first or high value, a second or mid value, and a third or low value as indicative of a relative voltage of VREF during different phases of use. At the beginning of the first initialization phase as shown in FIG. 2, the VREF signal level is changed from the high value to the mid value. A data voltage VDAT applied to transistor T4 (which currently is in the off state) is also raised to a fixed voltage level, denoted as $VDAT_{REF}$. In exemplary embodiments, $VDAT_{REF}$ is set as higher than a highest data voltage that can be applied during a subsequent data programming phase, denoted $VDAT_{Highest}$, which is a data voltage value corresponding to lowest greyscale value but low enough to ensure the OLED is not turned on during a subsequent threshold voltage compensation phase.

Also for effective threshold voltage compensation of the drive transistor T1, the applied VDAT voltage should be higher than $V_{TH}+V_{INIT\_L}+\Delta V$:

$$VDAT > |V_{TH}| + V_{INIT\_L} \Delta V$$

More particularly, $\Delta V$ is a voltage that is large enough to generate a high initial current to charge the storage capacitor within one horizontal time. The value of $\Delta V$ will depend on the properties of the transistors. For example, $\Delta V$ would be greater than three volts for one of low-temperature polycrystalline silicon thin film transistor processes.

These voltage relationships are illustrated by the following:

$$|V_{TH}|+V_{INIT\_L}+ \\ \Delta V < VDAT_{Highest} < VDAT_{REF} < |V_{TH_{OLED}}|+|V_{TH}|+ \\ V_{ELVSS}$$

wherein $V_{TH}$ is the threshold voltage of the drive transistor T1 and $V_{TH_{OLED}}$ is the threshold voltage of the OLED. As defined herein, a threshold voltage of the OLED is the maximum voltage difference between the anode and cathode of the OLED for which the output luminance of the OLED is less than 1.0%, and preferably less and 0.1%, of the maximum luminance of the OLED during any emission phase of the circuit.

At the end of the initialization phase, the SCAN1 signal level is changed from a low voltage value to a high voltage value, causing transistor T3 to be turned off. Consequently, the node N1 becomes floating.

The TFT circuit 10 next is operable in a threshold voltage compensation phase, during which any variation in the threshold voltage of the drive transistor T1 is compensated. During such phase, a SCAN signal level is changed from a high voltage value to a low voltage value, causing transistor T4 to be turned on. Consequently, the data voltage, VDAT$_{REF}$, described above is applied to the source of the drive transistor T1. From the initialization phase, the drive transistor T1 still is diode-connected through transistor T2. Accordingly, the diode-connected node N1 of the drive transistor T1 is pulled up until the voltage between the gate and source of the drive transistor, $V_{GS}$, is equal to the threshold voltage $V_{TH}$. By such operation, at the end of this compensation phase the voltage at node N1 is approximately equal to VDAT$_{REF}$+$V_{TH}$.

The TFT circuit 10 next is operable in a data programming phase, during which a current data voltage is programmed for driving the OLED during the later emission phase. During the programming phase, the data voltage VDAT is changed from the reference date voltage VDAT$_{REF}$ to a current data voltage value corresponding to the required OLED current in the subsequent emission phase, VDAT, i.e. the required greyscale value for the pixel in the current frame. The reference voltage VREF at the second plate of the storage capacitor Cst is changed from the mid level down to a low level, VREF_L, which pulls the voltage of the gate of the drive transistor, $V_{N2}$, to:

$$V_{INIT\_L} \leq V_{N2} < VDAT_{lowest}+V_{TH}$$

wherein VDAT$_{lowest}$ is the data voltage corresponding to the highest greyscale value for light emission from the OLED. This prevents any light emission during the programming phase.

At the end of the programming phase, therefore, the voltage at node N1 is approximately equal to VDAT+$V_{TH}$. Further at the end of the programming phase, the SCAN signal level is changed from a low voltage value to a high voltage value, causing transistor T4 to be turned off. Consequently, the source of the drive transistor T1 becomes floating. The SCAN2 signal level is changed from a low voltage value to a high voltage value, causing transistor T2 to be turned off. Consequently, the gate of driving transistor is disconnected from the drain, meaning the drive transistor T1 becomes no longer diode-connected.

As described previously, for effective threshold voltage compensation of the drive transistor T1, the VDAT voltage should be:

$$VDAT > |V_{TH}|+V_{INIT\_L}+\Delta V$$

in which $\Delta V > 3V$. Furthermore, to ensure no light emission during the compensation phase:

$$VDAT < |V_{TH_{OLED}}|+|V_{TH}|+V_{ELVSS}$$

with $V_{TH}$ being the threshold voltage of the drive transistor T1, and $V_{TH_{OLED}}$ being the OLED threshold voltage as defined above. Generally, the current through the OLED is less than 100 pA. Ordinarily, to satisfy both of these requirements, the VDAT range would need to be small, which is undesirable because control of the greyscale level for emission becomes difficult. The control of the pixel circuits described in this disclosure overcomes this limitation by splitting the threshold voltage compensation phase and data programming phase into two different phases. In this manner, the two above requirements can be separately met in the different phases, and both effective threshold voltage compensation and an optimally wide VDAT operational range are achieved.

The TFT circuit 10 next is operable in an emission phase during which the OLED is capable of emitting light. At the beginning of this phase, an emission second initialization phase may be performed.

In an emission second initialization phase, the voltage across the OLED is initialized or reset in preparation for the remaining emission phase. This phase further enhances the accuracy of the threshold voltage compensation of the drive transistor, particularly for low emission currents of the OLED.

At the end the data programming phase above, the voltage at the drain of the drive transistor T1 is approximately equal to VDAT+$V_{TH}$. Therefore, this voltage depends on the threshold voltage of the drive transistor T1. If the programmed current, i.e. the current that the drive transistor T1 will pass during the subsequent emission phase, is low, it could take some time to adjust the voltage at the drain of the drive transistor T1 to the correct level, and consequently the $V_{ds}$ (the voltage between the drain and source) across the drive transistor T1 could be different for the same programmed data. The secondary effects of $V_{ds}$ could cause the OLED current to be different before the drain voltage reaches the correct level. The emission second initialization phase helps to mitigate this problem. In particular, this phase improves the threshold voltage compensation accuracy particularly in circumstances in which the required OLED current in the subsequent emission phase is low.

During this emission second initialization phase, the initialization voltage INIT is changed from the first low voltage value, INIT_L, to a second high voltage value, INIT_H. The SCAN1 signal level is changed from a high voltage value to low voltage value, causing transistor T3 to be turned on. Consequently, node N1, which connects the drain of the drive transistor T1 and the anode of the OLED, is connected to INIT_H. By re-initializing the node N1, the starting voltages are the same level even when the threshold voltage of the drive transistor T1 varies. Having re-initialized node N1, at the end of this phase the SCAN1 signal level is changed from a low value to a high value, causing transistor T3 to be turned off.

Referring again to the emission phase, VREF is boosted back to the high voltage level, VREF_H, which boosts the gate voltage of the drive transistor T1 to the desired operational voltage range:

$$V_{N2}=VDAT+V_{TH}+\Delta V_{REF}$$

where $\Delta V_{REF}$=VREF_H−VREF_L.

The operational range is the gate voltage range of the drive transistor with which the drive transistor can control the amount of current to the light-emitting device from the lowest current to the highest current for the pixel circuit. For example, the current range is from 10 pA to 100 nA in some applications.

The EMI signal level is changed from high to low, causing transistor T5 to be turned on. The drive transistor T1 thus is connected to the second power supply, VDD, and conducts $I_{OLED}$ current to the OLED as follows:

$$I_{OLED} = \frac{\beta}{2}(VDAT + V_{TH} + \Delta VREF - VDD - V_{TH})^2 =$$

$$\frac{\beta}{2}(V_{DAT} + \Delta VREF - VDD)^2$$

where $\beta = \mu_n \cdot C_{ox} \cdot \frac{W}{L}$, $C_{ox}$ is the capacitance of the drive transistor gate oxide;
W is the width of the drive transistor channel;
L is the length of the drive transistor channel (i.e. distance between source and drain);
$\mu_n$ is the carrier mobility of the drive transistor.

Accordingly, the current to the OLED does not depend on the threshold voltage of the drive transistor T1, and hence the current to the OLED device $I_{OLED}$ is not affected by threshold voltage variations of the drive transistor. In this manner, variation in the threshold voltage of the drive transistor has been compensated.

Figure 3:
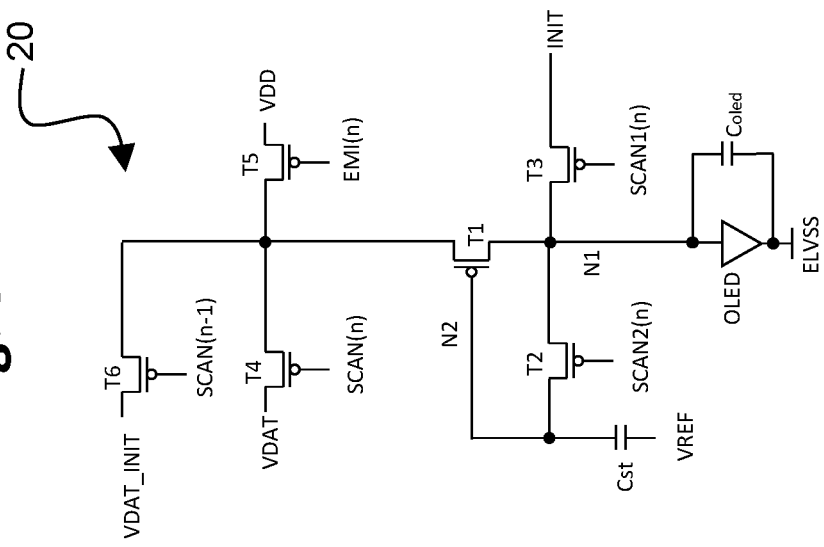
FIG. 3 is a drawing depicting a second circuit configuration in accordance with embodiments of the present invention.
Figure 4:
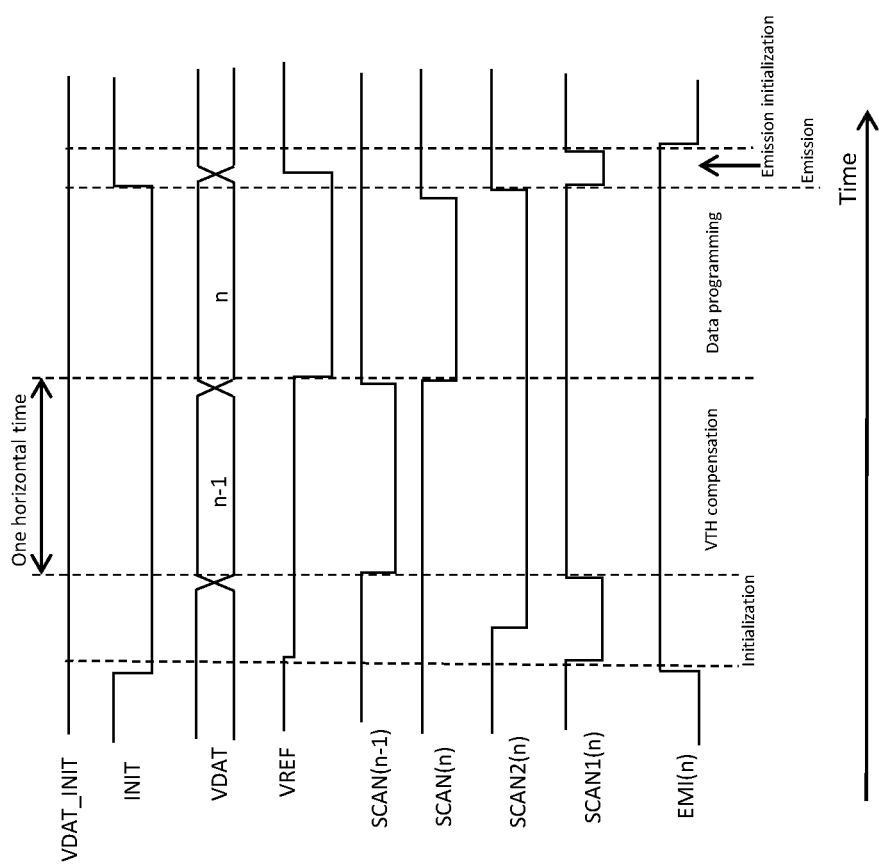
FIG. 4 is a timing diagram associated with the circuit configuration of FIG. 3.

FIG. 3 is a drawing depicting a second circuit configuration 20 in accordance with embodiments of the present invention, and FIG. 4 is a timing diagram associated with the circuit configuration of FIG. 3. In this example, similarly as in the previous embodiments, the circuit 20 is configured as a TFT circuit that includes multiple transistors, which in this embodiment are p-type transistors (T1-T6), and Cst is a capacitor. The circuit elements drive a light-emitting device, such as for example an OLED. The light-emitting device (OLED) has an associated internal capacitance, which is represented in the circuit diagram as $C_{oled}$. T1 is a drive transistor that is an analogue TFT, and T2-T6 are digital switch TFTs, with T6 being an additional transistor in this embodiment. $C_{oled}$ is the internal capacitance of the OLED device (i.e., $C_{oled}$ is not a separate component, but is inherent to the OLED). The OLED further is connected to the first power supply ELVSS.

Compared with the previous embodiment, a fixed VDAT_INIT voltage signal is added and applied through the additional sixth transistor T6 that is connected to the third terminal of the drive transistor T1. Application of VDAT_INIT is controlled by the adjacent (e.g. previous) row scan signal SCAN (n−1) (i.e., "n" denotes the current row, and thus, "n−1" denotes the previous row so SCAN(n−1) is the same signal as is supplied as the SCAN(n) signal for the previous row n) for threshold voltage compensation. The input VDAT provides the data voltage for each row. In this way, the programming speed or accuracy can be improved. In particular, as seen with reference to the timing diagram of FIG. 4, by employing a signal input SCAN(n−1) from the previous row for threshold voltage compensation, the horizontal time is significantly reduced. This enhanced efficiency is traded off with the use of an additional sixth transistor T6, which results in a larger circuit as compared to the previous embodiment.

The pixel circuit 20 of this embodiment also is operable in a first initialization phase, during which memory effects from residual voltages from the previous frame are essentially eliminated. During this first initialization phase, an EMI (n) signal level (EMI signal for the current row) is set to a high voltage level, causing transistor T5 to be off. The source of the drive transistor T1 thus is disconnected from the power supply, VDD. Comparably as in the previous embodiments, the initialization voltage INIT also is changed from a high reference voltage level which is similar to a low light emission voltage, INIT_H, at the anode of the OLED, to a low reference voltage level, INIT_L, which may reverse bias the OLED but does not degrade the OLED as detailed above.

Further during the first initialization phase, the SCAN1(n) signal level (SCAN1 signal for the current row) is changed from a high voltage level to low voltage level, causing transistor T3 to be turned on. The low initialization voltage, INIT_L, is thus applied at the anode of the OLED. Any residual voltage and memory effect from the previous frame will be reset to INIT_L. The SCAN2(n) signal level also changes from high to low, causing transistor T2 to be turned on. The drive transistor T1 thus becomes diode-connected through transistor T2, and thereby the gate and drain of the drive transistor T1 also are initialized to the INIT_L through T2 and T3. With the drive transistor T1 diode-connected, the initialization voltage also is applied at a first (top) plate of the storage capacitor Cst. Similarly as in the previous embodiment, T3 preferably is turned on before T2.

Further during the first initialization phase, the reference voltage at the second (bottom) plate of the storage capacitor Cst, VREF is reduced to the mid reference level, VREF_M, as part of the initialization. At the end of the initialization phase, the SCAN1(n) signal level is changed from low to high, causing transistor T3 to be turned off, which renders node N1 floating.

The TFT circuit 20 next is operable in a threshold voltage compensation phase, during which any variation in the threshold voltage of the drive transistor T1 is compensated. During such phase, a SCAN(n−1) signal level (SCAN signal from the previous row) is changed from a high voltage level to a low voltage level, causing transistor T6 to be turned on. The fixed voltage, VDAT_INIT, is thus applied to the source of the drive transistor. The diode-connected node of the drive transistor is pulled up until the $V_{GS}$ (gate to source voltage) of the drive transistor T1 is equal to the threshold voltage $V_{TH}$. At the end of this phase, the voltage at node N1 is VDAT_INIT+$V_{TH}$. The voltage VDAT_INIT is set as higher than the highest data voltage range but low enough to ensure the OLED is not turned on during threshold voltage compensation.

Similarly as described previously, for effective threshold voltage compensation of the drive transistor T1, the applied VDAT voltage should be higher than $V_{TH}$+$V_{INIT\_L}$+$\Delta V$:

$VDAT > |V_{TH}| + V_{INIT\_L} + \Delta V$

Accordingly, the following relationship is satisfied:

$|V_{TH}+V_{INIT\_L}| + \Delta V < VDAT_{Highest} < VDAT\_INIT < |V_{TH_{OLED}}| + |V_{TH}| + V_{ELVSS}$ At the end of this phase, the SCAN(n−1) signal level is changed from low to high, causing transistor T6 to be turned off.

The TFT circuit 20 next is operable in a data programming phase, during which data voltage is programmed for driving the OLED during the later emission phase. During the programming phase, the data voltage is changed from previous row data, VDAT(n−1), to current row data, VDAT (n). The SCAN(n) signal level is changed from a high voltage level to a low voltage level, causing transistor T4 to be turned on. The data voltage VDAT(n) is applied at the source of the drive transistor. The reference voltage VREF at the second (bottom) plate of the capacitor is reduced to a level, VREF_L, which pulls the gate voltage of the drive transistor T1, $V_{H2}$, to $$V_{INIT\_L} \leq V_{N2} < VDAT_{lowest} + V_{TH}$$

Accordingly, at the end of this phase, the voltage at node N1 is VDAT(n)+$V_{TH}$. In addition, the SCAN(n) signal level is changed from low to high, causing transistor T4 to be turned off. The source of the driving transistor T1 thus becomes floating. The SCAN2(n) signal level is changed from low to high, causing transistor T2 to turned off, and the gate of drive transistor T1 is disconnected from the drain such that the drive transistor T1 is no longer diode-connected through transistor T2, and the current data voltage effectively is stored by the storage capacitor Cst.

The TFT circuit 20 next is operable in an emission phase during which the OLED is capable of emitting light. At the beginning of this phase, an emission second initialization phase may be performed. During the emission second initialization phase, the voltage across the OLED is initialized or reset in preparation for the remaining emission phase. Similarly as in the previous embodiment, this phase improves the threshold voltage compensation accuracy particularly for circumstances of low emission current. During this emission second initialization phase, the initialization voltage INIT is changed from the first low voltage level, INIT_L, to the second high voltage level, INIT_H. The SCAN1(n) signal level is changed from a high voltage level to a low voltage level, and transistor T3 is turned on. Node N1, which connects the drain of the drive transistor T1 and the anode of the OLED, is thus connected to INIT_H.

As described above, at the end the threshold voltage compensation phase, the drain voltage of the drive transistor T1 could be different. If the programmed current for light emission is low, it could take a long time for the drain voltage of the drive transistor T1 to recover. The voltage at the anode of the OLED could vary so the light emission may vary depending on the threshold voltage of the drive transistor T1. By re-initializing the node N1, the starting voltages are the same level even when the threshold voltages vary.

At the end of the emission second initialization phase, the SCAN1(n) signal level is changed from low to high causing transistor T3 to be turned off. In addition, VREF is also boosted to the high voltage level, VREF_H, which boosts the gate voltage of the drive transistor T1 device to the desired operational voltage range:

$$V_{N2} = VDAT + V_{TH} + \Delta V_{REF}$$

Referring again to the emission phase, the EMI(n) signal level is changed from a high voltage level to a low voltage level, causing transistor T5 to be turned on. The drive transistor T1 thus is connected to the second power supply, VDD and conducts current to the OLED as follows:

$$I_{OLED} = \frac{\beta}{2}(VDAT + V_{TH} + \Delta VREF - VDD - V_{TH})^2 =$$
$$\frac{\beta}{2}(V_{DAT} + \Delta VREF - VDD)^2$$

where $\beta = \mu_n \cdot C_{ox} \cdot \frac{W}{L}$, $C_{ox}$ is the capacitance of the drive transistor gate oxide;
W is the width of the drive transistor channel;
L is the length of the drive transistor channel (i.e. distance between source and drain);
$\mu_n$ is the carrier mobility of the drive transistor.

Accordingly, the current to the OLED does not depend on the threshold voltage of the drive transistor T1, and hence the current to the OLED device $I_{OLED}$ is not affected by threshold voltage variations of the drive transistor. In this manner, variation in the threshold voltage of the drive transistor has been compensated.

Although embodiments described herein are circuits using p-type TFTs, those skilled in the art can apply the invention also to circuits using n-type TFTs. Furthermore, although embodiments described herein include light-emitting devices with an anode connected to the drive transistor, the cathode of a light-emitting device may alternatively be connected to the drive transistor. For example, the advantages of the described circuit configurations may be obtained for a circuit using n-type TFTs and the cathode of the light-emitting device connected to the drive transistor.

The described pixel circuits have advantages over conventional configurations. Such circuit configurations are capable of compensating the threshold voltage variations with fewer transistors than in conventional configurations, with additionally removing the possible memory effects associated with the OLED device and drive transistor from the previous frame. The described circuit configurations, therefore, improve the capability of a pixel to emit very little or no light and therefore have a true black state, and over a wide range of data values. The pixel circuit configurations of the present disclosure further improve the true blackness by reversely biasing the OLED during phases prior to emission, and in particular, by further employing the emission second initialization phase, accuracy of threshold voltage compensation of the drive circuit is improved especially for low OLED currents. In addition, the voltage range for the pixel circuit (i.e., the difference between the highest voltage in the pixel circuit and the lowest voltage in the pixel circuit) is reduced while still providing effective compensation of the threshold voltage of the drive transistor. The reduced range for the pixel circuit enables lower power consumption for a driver of the display as compared to conventional configurations.

The advantages may be achieved using as few as only five transistors and one storage capacitor, thereby providing a smaller circuit as compared to conventional configurations. By the addition of a sixth transistor in the second embodiment, although the circuit size is increased, the circuit size still is small as compared to conventional configurations, and a significantly shortened horizontal time is achieved.

The various embodiments have been described in connection with OLEDs as the display light-emitting device. The circuit configurations, however, are not limited to any particular display technology. For example, the circuit configurations also may also be used for micro LED displays, quantum dot LED displays, or any other device which emits light in response to an applied electrical bias. A micro LED, for example, is a semiconductor device containing a p-type region, an n-type region and a light emission region, for example formed on a substrate and divided into individual chips. A micro LED may be based on a III-nitride semiconductor. A quantum dot LED, for example, is a device containing a hole transport layer, an electron transport layer, and a light emission region, wherein the light emission regions contains nanocrystalline quantum dots. The circuit configurations, described herein may be employed for any such display technologies.

An aspect of the invention is a pixel circuit for a display device that performs compensation of variations in drive transistor properties in a small configuration, with additionally removing the possible memory effects from the previous frame. In exemplary embodiments, the pixel circuit includes a drive transistor configured to control an amount of current to a light-emitting device depending upon a voltage applied to a gate of the drive transistor; a second transistor connected to the gate of the drive transistor and a second terminal of the drive transistor such that, when the second transistor is in an on state the drive transistor becomes diode-connected such that the gate and a second terminal of the drive transistor are connected through the second transistor; a light-emitting device that is connected at a first node to the second terminal of the drive transistor and at a second node to a first voltage supply; a third transistor that is connected between an initialization voltage supply and the first node of the light-emitting device, wherein a node N1 is a connection of the second terminal of the drive transistor, the first node of the light-emitting device, and the third transistor; and at least one capacitor having a first plate that is connected to the gate of the drive transistor and a second plate that is connectable to a reference voltage supply. The pixel circuit may include one or more of the following features, either individually or in combination.

In an exemplary embodiment of the pixel circuit, the pixel circuit is operable in an initialization phase, and during the initialization phase the second and third transistors are in an on state such that a first initialization voltage is connected to the first plate of the capacitor, the gate of the drive transistor, and the first node of the light-emitting device.

In an exemplary embodiment of the pixel circuit, the first initialization voltage is lower than the first voltage supply.

In an exemplary embodiment of the pixel circuit, the pixel circuit is operable in a compensation phase, and during the compensation phase a reference data voltage is applied at the third terminal of the drive transistor and the reference voltage applied at the second plate of the capacitor has a first voltage; and the pixel circuit is operable in a programming phase, and during the programming phase a data voltage corresponding to a greyscale value is applied at the third terminal of the drive transistor and the reference data voltage applied the second plate of the capacitor has a second voltage.

In an exemplary embodiment of the pixel circuit, the pixel circuit further is operable during an emission second initialization phase, wherein during the emission second initialization phase the third transistor is in an on state to connect a second initialization voltage to the node N1.

In an exemplary embodiment of the pixel circuit, the pixel circuit further includes a fourth transistor that is connected to a third terminal of the drive transistor.

In an exemplary embodiment of the pixel circuit, the pixel circuit further includes a fifth transistor that is connected to the third terminal of the drive transistor, wherein during an emission phase the fifth transistor is in an on state to connect the drive transistor to a second voltage supply and the reference voltage has a third voltage.

In an exemplary embodiment of the pixel circuit, the pixel circuit further includes a sixth transistor that is connected to the third terminal of the drive transistor, wherein during a compensation phase the sixth transistor is in an on state to apply a fixed voltage to the third terminal of the drive transistor.

In an exemplary embodiment of the pixel circuit, the transistors all are p-type transistors.

In an exemplary embodiment of the pixel circuit, the first node of the light-emitting device is an anode and the second node of the light emitting device is a cathode.

In an exemplary embodiment of the pixel circuit, the light-emitting device is one of an organic light-emitting diode, a micro light-emitting diode (LED), or a quantum dot LED.

Another aspect of the invention is a method of operating a pixel circuit for a display device including the steps of: providing a pixel circuit according to any of the embodiments; and performing an initialization phase, a compensation phase, a programming phase, and an emission phase. During the initialization phase, memory effects from previous frames are reduced by performing the steps of: placing the fourth transistor in the off state, and placing the fifth transistor in the off state to disconnect the second voltage supply from the pixel circuit; placing the third transistor in the on state to apply a first initialization voltage to the first node of the light-emitting device; setting the reference voltage to a first voltage; placing the second transistor in an on state, wherein the drive transistor becomes diode-connected through the second transistor such that the first initialization voltage is applied to the gate of the drive transistor and the first plate of the capacitor; and placing the third transistor in the off state at an end of the initialization phase. During the compensation phase, a threshold voltage of the drive transistor is at least partially compensated by the steps of: placing the fourth transistor in an on state and applying a reference data voltage through the fourth transistor to the third terminal of the drive transistor, wherein the reference data voltage is set such that a voltage across the light-emitting device is below a threshold voltage of the light emitting device. During the programming phase, a data voltage corresponding to a current greyscale value is applied by the steps of: setting the reference voltage to a second voltage for programming the full data range; and changing the data voltage supply from the reference data voltage to a current data voltage corresponding to a required current through the light-emitting device during the emission phase; placing the fourth transistor in an off state after applying the current data voltage; and placing the second transistor in an off state such that the drive transistor is no longer diode-connected, wherein the current data voltage is stored by the storage capacitor. The emission phase includes the steps of: setting the reference voltage to a third voltage to change the gate voltage of the drive transistor to the operational voltage range, in which the drive transistor controls the amount of current to the light-emitting device; placing the fifth transistor in the on state to connect the second power supply to the drive transistor; and controlling an amount of current to the light-emitting device depending upon a voltage at the gate of a drive transistor. The operating method may include one or more of the following features, either individually or in combination.

In an exemplary embodiment of the operating method, during the initialization phase the third transistor is placed in the on state prior to placing the second transistor in the on state.

In an exemplary embodiment of the operating method, the first initialization voltage reverse biases the light-emitting device.

In an exemplary embodiment of the operating method, the reference voltage applied to the second plate of the storage capacitor is a multi-level voltage that is different during the first initialization phase and the programming phase.

In an exemplary embodiment of the operating method, the reference data voltage is a data value corresponding to a lowest greyscale value of the light-emitting device.

In an exemplary embodiment of the operating method, the operating method further includes, after the programming phase and at the beginning of the emission phase, performing an emission second initialization phase to reset the voltage at the first node of the light-emitting device by the steps of: placing the third transistor in an on state and applying a second initialization voltage to the first node of the light-emitting device; and changing the state of the third transistor from the on state to the off state.

In an exemplary embodiment of the operating method, the first initialization voltage is a lower voltage than the second initialization voltage, In an exemplary embodiment of the operating method, the pixel circuit further comprises a sixth transistor that is connected to the third terminal of the drive transistor, wherein during the compensation phase the sixth transistor is in an on state to apply a fixed voltage through the sixth transistor to the third terminal of the drive transistor.

In an exemplary embodiment of the operating method, the light-emitting device is one of an organic light-emitting diode, a micro light-emitting diode (LED), or a quantum dot LED.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

Embodiments of the present invention are applicable to many display devices to permit display devices of high resolution with effective threshold voltage compensation and true black performance. Examples of such devices include televisions, mobile phones, personal digital assistants (PDAs), tablet and laptop computers, desktop monitors, digital cameras, and like devices for which a high resolution display is desirable.

REFERENCE SIGNS LIST

10—first circuit configuration
20—second circuit configuration
T1—drive transistor
T2-T6—multiple switch transistors
Cst—storage capacitor
$C_{oled}$—internal capacitance of light-emitting device
ELVSS—first power supply
VDD—second power supply
VDAT—data voltage supply
VREF—reference voltage supply
INIT—initialization voltage supply
VDAT_INIT—initialization data voltage supply
N1—first circuit node
N2—second circuit node
SCAN/EMI—control signals
1H—one horizontal time

What is claimed is:

1. A pixel circuit for a display device comprising:
   a drive transistor configured to control an amount of current to a light-emitting device depending upon a voltage applied to a gate of the drive transistor;
   a second transistor connected to the gate of the drive transistor and a second terminal of the drive transistor such that, when the second transistor is in an on state the drive transistor becomes diode-connected such that the gate and a second terminal of the drive transistor are connected through the second transistor;
   a light-emitting device that is connected at a first node to the second terminal of the drive transistor and at a second node to a first voltage supply, wherein the gate of the drive transistor is connected to the first node of the light-emitting device only through the second transistor;
   a third transistor that is connected between an initialization voltage supply and the first node of the light-emitting device, wherein a node N1 is a connection of the second terminal of the drive transistor, the first node of the light-emitting device, and the third transistor; and
   at least one capacitor having a first plate that is connected to the gate of the drive transistor and a second plate that is connectable to a reference voltage supply;
   wherein the pixel circuit is operable in an initialization phase, and during the initialization phase the second and third transistors are in an on state such that a first initialization voltage is connected to the first plate of the capacitor, the gate of the drive transistor, and the first node of the light-emitting device.

2. The pixel circuit of claim 1, wherein the first initialization voltage is lower than the first voltage supply.

3. A method of operating a pixel circuit for a display device that is operable in an initialization phase, a compensation phase, a programming phase, and an emission phase; the operating method comprising the steps of:
   providing a pixel circuit comprising:
      a drive transistor configured to control an amount of current to the light-emitting device during the emission phase depending upon a voltage applied to a gate of the drive transistor;
      a second transistor connected to the gate of the drive transistor, wherein the drive transistor can be diode-connected between the gate and a second terminal of the drive transistor through the second transistor;
      a light-emitting device that is connected at a first node to the second terminal of the drive transistor and at a second node to a first voltage supply;
      a third transistor that is connected to the first node of the light-emitting device,
      a fourth transistor that is connected between a third terminal of the drive transistor and a data voltage supply;
      a fifth transistor that is connected between the third terminal of the drive transistor and a second voltage supply; and a capacitor having a first plate that is connected to the gate of the drive transistor and a second plate that is connectable to a reference voltage supply;

during the initialization phase, reducing memory effects from previous frames by performing the steps of:
- placing the fourth transistor in the off state, and placing the fifth transistor in the off state to disconnect the second voltage supply from the pixel circuit;
- placing the third transistor in the on state to apply a first initialization voltage to the first node of the light-emitting device;
- setting the reference voltage to a first voltage;
- placing the second transistor in an on state, wherein the drive transistor becomes diode-connected through the second transistor such that the first initialization voltage is applied to the gate of the drive transistor and the first plate of the capacitor; and
- placing the third transistor in the off state at an end of the initialization phase;

during the compensation phase, at least partially compensating a threshold voltage of the drive transistor by the steps of:
- placing the fourth transistor in an on state and applying a reference data voltage through the fourth transistor to the third terminal of the drive transistor, wherein the reference data voltage is set such that a voltage across the light-emitting device is below a threshold voltage of the light emitting device;

during the programming phase applying a data voltage corresponding to a current greyscale value by the steps of:
- setting the reference voltage to a second voltage for programming the full data range; and
- changing the data voltage supply from the reference data voltage to a current data voltage corresponding to a required current through the light-emitting device during the emission phase;
- placing the fourth transistor in an off state after applying the current data voltage; and
- placing the second transistor in an off state such that the drive transistor is no longer diode-connected, wherein the current data voltage is stored by the storage capacitor;

and during the emission phase, performing the steps of:
- setting the reference voltage to a third voltage to change the gate voltage of the drive transistor to the operational voltage range, in which the drive transistor controls the amount of current to the light-emitting device;
- placing the fifth transistor in the on state to connect the second power supply to the drive transistor; and
- controlling an amount of current to the light-emitting device depending upon a voltage at the gate of a drive transistor.

4. The operating method of claim 3, wherein during the initialization phase the third transistor is placed in the on state prior to placing the second transistor in the on state.

5. The operating method of claim 3, wherein the first initialization voltage reverse biases the light-emitting device.

6. The operating method of claim 3, wherein the reference voltage applied to the second plate of the storage capacitor is a multi-level voltage that is different during the first initialization phase and the programming phase.

7. The operating method of claim 3, wherein the reference data voltage is a data value corresponding to a lowest greyscale value of the light-emitting device.

8. The operation method of claim 3, further comprising, after the programming phase and at the beginning of the emission phase, performing an emission second initialization phase to reset the voltage at the first node of the light-emitting device by the steps of:
- placing the third transistor in an on state and applying a second initialization voltage to the first node of the light-emitting device; and
- changing the state of the third transistor from the on state to the off state.

9. The operating method of claim 8, wherein the first initialization voltage is a lower voltage than the second initialization voltage.

10. The operating method of claim 3, wherein the pixel circuit further comprises a sixth transistor that is connected to the third terminal of the drive transistor, wherein during the compensation phase the sixth transistor is in an on state to apply a fixed voltage through the sixth transistor to the third terminal of the drive transistor.

11. A pixel circuit for a display device comprising:
- a drive transistor configured to control an amount of current to a light-emitting device depending upon a voltage applied to a gate of the drive transistor;
- a second transistor connected to the gate of the drive transistor and a second terminal of the drive transistor such that, when the second transistor is in an on state the drive transistor becomes diode-connected such that the gate and a second terminal of the drive transistor are connected through the second transistor;
- a light-emitting device that is connected at a first node to the second terminal of the drive transistor and at a second node to a first voltage supply;
- a third transistor that is connected between an initialization voltage supply and the first node of the light-emitting device, wherein a node N1 is a connection of the second terminal of the drive transistor, the first node of the light-emitting device, and the third transistor; and
- at least one capacitor having a first plate that is connected to the gate of the drive transistor and a second plate that is connectable to a reference voltage supply;
- wherein the pixel circuit is operable in an initialization phase, and during the initialization phase the second and third transistors are in an on state such that a first initialization voltage is connected to the first plate of the capacitor, the gate of the drive transistor, and the first node of the light-emitting device.

12. The pixel circuit of claim 11, wherein the first initialization voltage is lower than the first voltage supply.

13. The pixel circuit of claim 11, wherein:
the pixel circuit is operable in a compensation phase, and during the compensation phase a reference data voltage is applied at a third terminal of the drive transistor and the reference voltage applied at the second plate of the capacitor has a first voltage; and
the pixel circuit is operable in a programming phase, and during the programming phase a data voltage corresponding to a greyscale value is applied at the third terminal of the drive transistor and the reference voltage applied at the second plate of the capacitor has a second voltage.

14. The pixel circuit of claim 11, wherein the pixel circuit further is operable during an emission second initialization phase, wherein during the emission second initialization phase the third transistor is in an on state to connect a second initialization voltage to the node N1.

15. The pixel circuit of claim 11, further comprising a fourth transistor that is connected to a third terminal of the drive transistor.

16. The pixel circuit of claim 15, further comprising a fifth transistor that is connected to the third terminal of the drive transistor, wherein during an emission phase the fifth transistor is in an on state to connect the drive transistor to a second voltage supply and the reference voltage has a third voltage.

17. The pixel circuit of claim 16, further comprising a sixth transistor that is connected to the third terminal of the drive transistor, wherein during a compensation phase the sixth transistor is in an on state to apply a fixed voltage to the third terminal of the drive transistor.

18. The pixel circuit of claim 11, wherein the transistors all are p-type transistors.

19. The pixel circuit of claim 11, wherein the first node of the light-emitting device is an anode and the second node of the light emitting device is a cathode.

20. The pixel circuit of claim 11, wherein the light-emitting device is one of an organic light-emitting diode, a micro light-emitting diode (LED), or a quantum dot LED.

* * * * *